United States Patent
Greenberg (10) Patent No.: US 7,327,400 B1
(45) Date of Patent: Feb. 5, 2008

(54) AUTOMATIC PHASE AND FREQUENCY ADJUSTMENT CIRCUIT AND METHOD

(75) Inventor: Robert Y. Greenberg, Portland, OR (US)

(73) Assignee: Pixelworks, Inc., Tualatin, OR (US)

( * ) Notice: Subject to any disclaimer, the term of this patent is extended or adjusted under 35 U.S.C. 154(b) by 396 days.

(21) Appl. No.: 09/888,271

(22) Filed: Jun. 21, 2001

Related U.S. Application Data (60) Provisional application No. 60/213,202, filed on Jun. 21, 2000.

(51) Int. Cl.
*H03L 7/00* (2006.01)
(52) U.S. Cl. .................. 348/536; 348/537; 348/541
(58) Field of Classification Search ........... 348/536, 348/537, 572, 538, 540, 541; 375/355, 359, 375/360, 362, 364, 371, 373; *H03L 7/00*
See application file for complete search history.

(56) References Cited

U.S. PATENT DOCUMENTS

| | | | | |
|---|---|---|---|---|
| 5,731,843 | A * | 3/1998 | Cappels, Sr. ............ | 348/537 |
| 5,940,136 | A * | 8/1999 | Abe et al. ................ | 348/537 |
| 6,097,379 | A * | 8/2000 | Ichiraku .................. | 345/213 |
| 6,226,045 | B1 * | 5/2001 | Vidovich ................. | 348/539 |
| 6,304,296 | B1 * | 10/2001 | Yoneno .................... | 348/537 |
| 6,522,365 | B1 * | 2/2003 | Levantovsky et al. ..... | 348/537 |
| 6,538,648 | B1 * | 3/2003 | Koike et al. .............. | 345/213 |
| 6,621,480 | B1 * | 9/2003 | Morita ...................... | 345/99 |

* cited by examiner

*Primary Examiner*—Trang U. Tran
(74) *Attorney, Agent, or Firm*—Marger Johnson & McCollom PC (57) ABSTRACT

The invention is a circuit and method for automatically adjusting the phase and frequency of a pixel clock derived from analog image data. The circuit includes a phase locked loop circuit adapted to generate a phase locked loop clock responsive to a reference signal and an edge detector circuit adapted to generate an edge pulse signal corresponding to a transition of an analog data signal. A phase detector circuit is adapted to identify a phase of the phase locked loop clock associated to the transition of the analog data and thereby generate a phase adjust signal. A phase adjust circuit is adapted to generate a pixel clock by adjusting the phase of the phase locked loop clock responsive to the phase adjust signal.

16 Claims, 7 Drawing Sheets

AUTOMATIC PHASE AND FREQUENCY ADJUSTMENT CIRCUIT AND METHOD

This application claims priority to U.S. Provisional Patent Application Ser. No. 60/213,202 filed Jun. 21, 2000, which is incorporated by reference in its entirety.

BACKGROUND OF THE INVENTION

1. Field of the Invention

This invention relates to a system adapted to visually display image data and, more particularly, to a circuit and method adapted to automatically adjust the phase and frequency of a pixel clock derived from analog image data.

2. Description of the Related Art

Computers, televisions, video cameras, and other sources generate analog image data that is often digitized for eventual display on a digital display device. A pixel clock is necessary to properly digitize the analog image data. The pixel clock clocks the analog to digital converter that converts the analog image data into digital image data. Although the analog image data does not include the pixel clock, it does include a horizontal synchronization signal often used to generate the necessary pixel clock.

Figure 1:
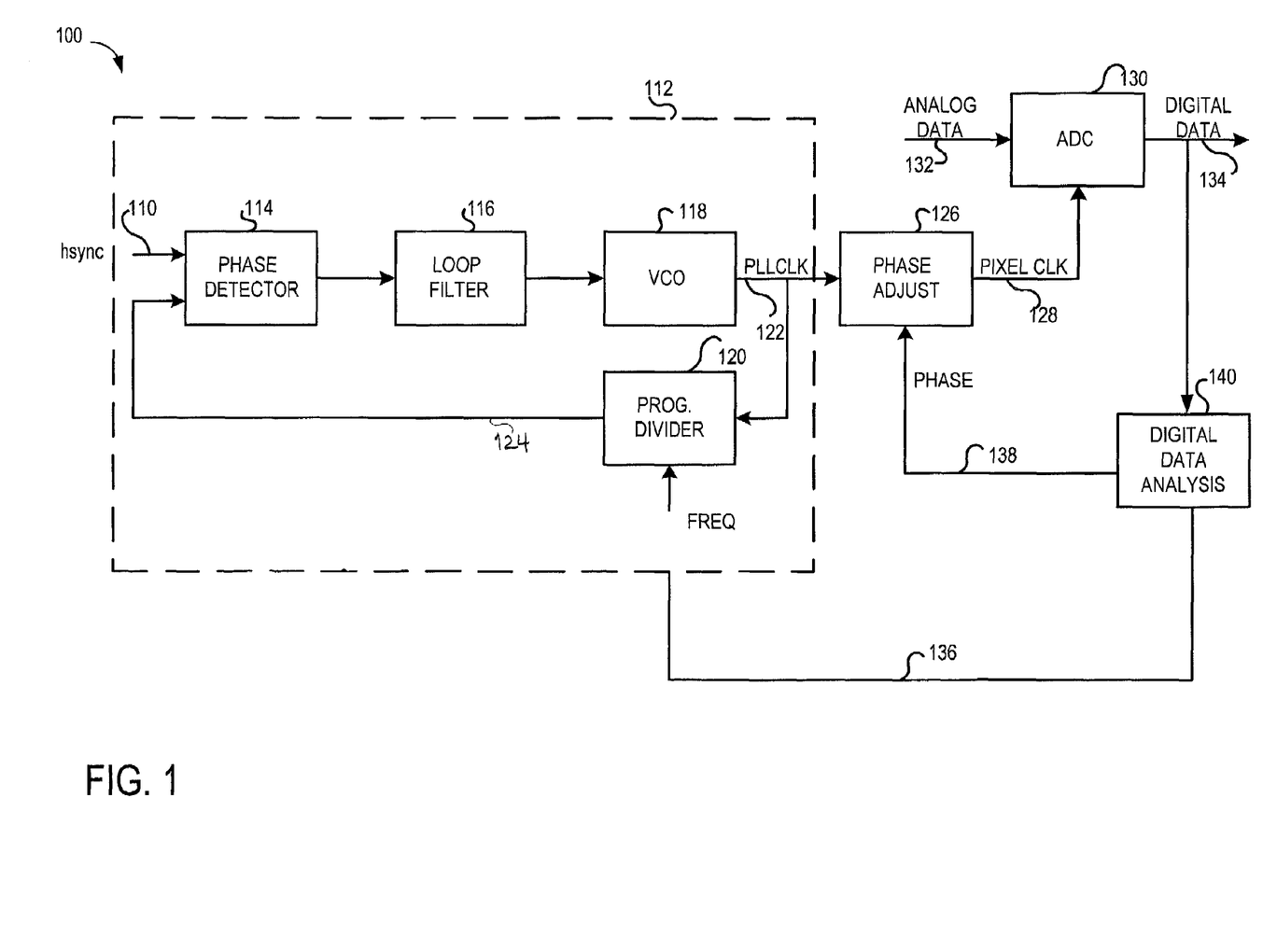
FIG. 1 is a block diagram of a phase and frequency adjust circuit.

FIG. 1 is a block diagram of a circuit 100 including a phase locked loop (PLL) circuit 112 used to recover a pixel clock 128 from a reference or horizontal synchronization signal 110 for corresponding analog image data 132. The PLL circuit 112 includes a phase detector 114 serially connected to a loop filter 116 and a voltage controlled oscillator (VCO) 118. The PLL feedback loop comprises a programmable divider 120 that receives the VCO clock signal 122 and provides feedback signal 124 to the phase detector 114 responsive to a frequency adjust signal 136. The PLL circuit 112 is well known to those skilled in the art and will not be explained in further detail.

A phase adjust circuit 126 receives the VCO clock signal 122 and provides the pixel clock 128 to the analog to digital converter (ADC) 130 responsive to a phase adjust signal 138. The ADC 130 converts the analog image data 132 into digital image data 134 responsive to the pixel clock 128.

A digital data analysis circuit 140 generates the frequency and phase adjust signals 136 and 138, respectively, from an analysis of the digital data 134. To obtain a noise free image, the digital data 134 must be properly clocked. That is, the pixel clock 128 must have a phase and frequency appropriate for the analog data 132. The phase adjust circuit 126 uses the phase signal 138 to adjust the phase of the pixel clock 128 such that pixels sampled when the analog data 132 is stable and not in transition. The PLL circuit 112 uses the frequency signal 136 to adjust the frequency of the VCO clock 122 and consequently, the pixel clock 128. That is, such that the PLL circuit 112 is set to the proper multiple of the reference or horizontal synchronization signal 110.

The phase and frequency adjust circuit 100 relies on a feedback loop that examines the digital data 134 and makes adjustments to the phase and frequency of the pixel clock 128 until the digital data 134 is stable and noise free. One disadvantage associated with circuit 100 is that the phase and frequency adjustment might take several seconds to complete. Another disadvantage is that the error rate (or effectiveness) depends on the digital data 134. Yet another disadvantage is that the circuit 100 might not work correctly or consistently for images that do not completely fill the digital display device (not shown) at the expected resolution.

Accordingly, a need remains for an improved automatic phase and frequency adjust circuit and method.

BRIEF DESCRIPTION OF THE DRAWINGS

The foregoing and other objects, features, and advantages of the invention will become more readily apparent from the following detailed description of a preferred embodiment that proceeds with reference to the following drawings.

DETAILED DESCRIPTION OF THE PREFERRED EMBODIMENT

Figure 2:
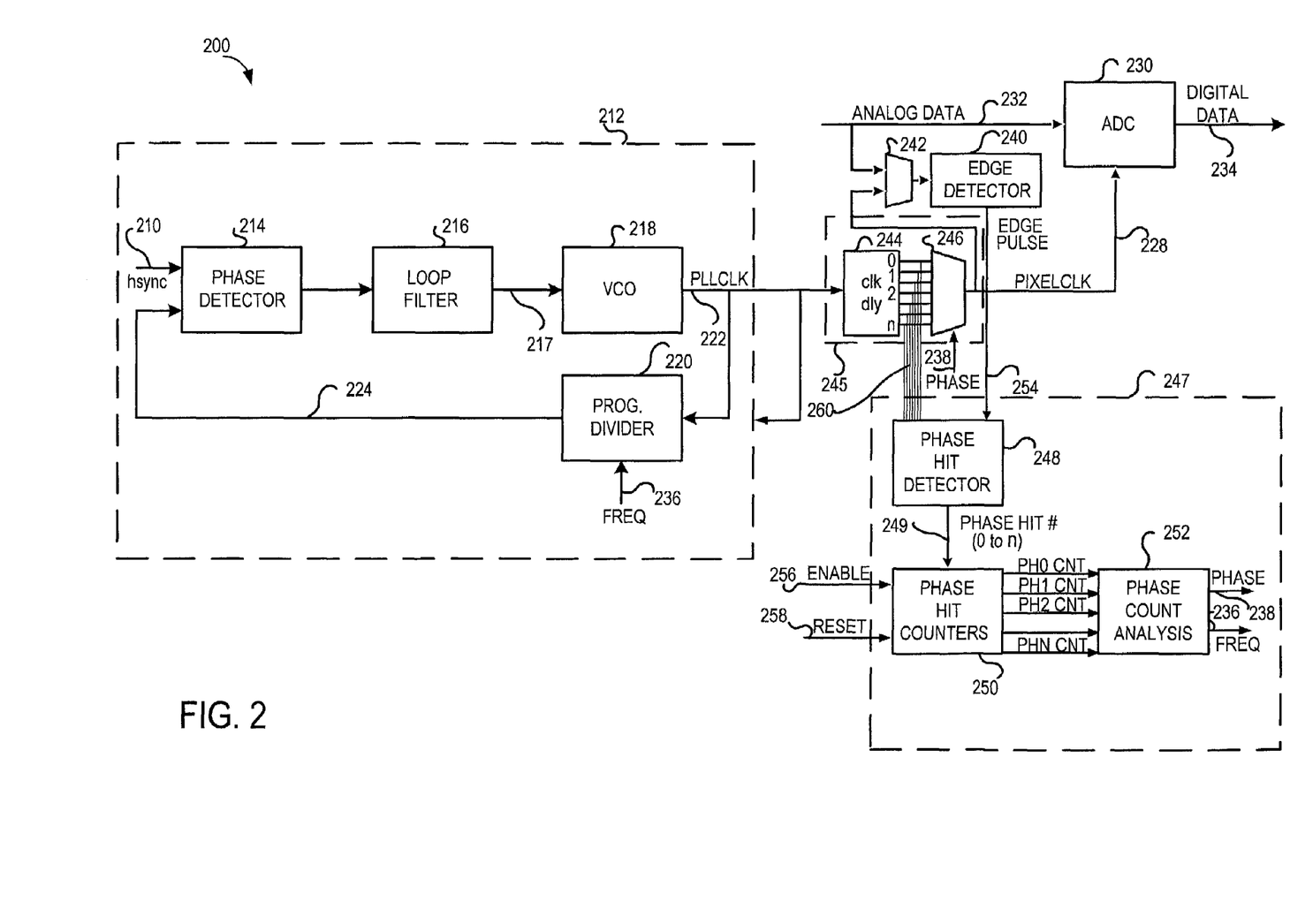
FIG. 2 is a block diagram of an embodiment of an automatic phase and frequency adjust circuit of the present invention.

Referring to FIG. 2, an automatic phase and frequency adjust circuit 200 includes a low-jitter PLL circuit 212 used to recover a PLL clock 222 from a reference signal 210. The reference signal 210 in one embodiment is a horizontal synchronization signal corresponding to analog image data 232. The PLL circuit 212 includes a phase detector 214 serially connected to a loop filter 216 and a VCO 218. The phase detector 214 produces a direct current or low frequency signal proportional to the phase difference between the incoming signal and the signal 224. The VCO 218 is an oscillator whose frequency is proportional to an externally applied voltage. When the PLL 212 is locked on to the reference signal 210, the VCO 218 frequency is exactly equal to that of the reference signal 110.

The PLL feedback loop comprises the VCO 218 and a programmable divider 220 that receives the PLL clock 222 and provides feedback signal 224 to the phase detector 214 responsive to a frequency adjust signal 236.

If, for example, the frequency of the reference signal 210 shifts slightly, the phase difference between the PLL clock 222 and the reference signal 210 will begin to increase with time. This will change the control or input voltage 217 on the VCO 218 in such a way as to bring the VCO frequency back to the same value as the reference signal 210. Thus, the PLL circuit 212 can maintain lock when the input frequency changes and the VCO input voltage 217 is proportional to the frequency of the reference signal 210. The operation of the PLL circuit 212 is well known to those skilled in the art and will not be explained in further detail.

An edge detector circuit 240 generates an edge pulse signal 254 of arbitrary width corresponding to a transition of the analog signal 232 above a predetermined threshold (not shown). The threshold (not shown) allows the circuit 200 to ignore small amounts of noise on the analog data signal 232.

The threshold (not shown) might be fixed or user programmable through external and/or internal means (not shown) such as system software (not shown). The threshold, for example, might be set at ½ of a full signal range or it might be dynamically set before, during, or both before and during reception of the analog data signal 232 depending on a variety of circumstances such as the type of analog data signal received. The edge detector 240, for example, might detect an analog data signal transition above ½ of the full signal range and will generate a corresponding edge signal pulse 254. A person skilled in the art should recognize that the threshold might be set in a variety of ways and implemented in a variety of manners.

Figure 3:
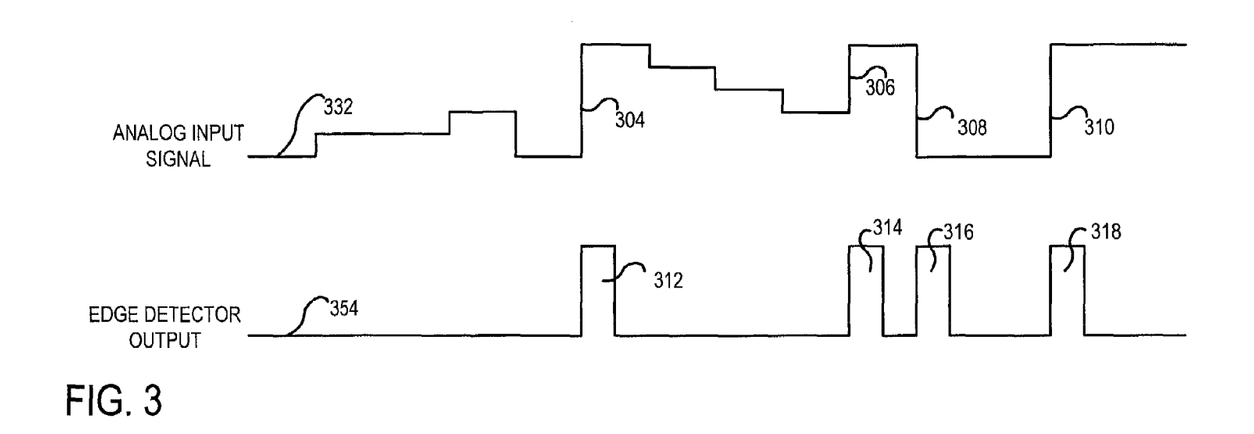
FIG. 3 is a timing diagram of the signals associated with an embodiment of the edge detector circuit shown in FIG. 2.

FIG. 3 shows exemplary timing signals for an analog signal 332 and an edge pulse signal 354. Referring to FIGS. 2 and 3, the edge detector 240 (FIG. 2) generates a pulse 312 on the edge pulse signal 354 responsive to detecting a transition 304 above a predetermined threshold, e.g., ½ signal range. Similarly, the edge detector 240 (FIG. 2) generates pulses 314, 316, and 318 responsive to detecting transitions 306, 308, or 310 above a predetermined threshold.

The edge detector 240 might detect rising, falling, or rising and falling edge transitions of the analog signal 232. For example, the edge detector 240 (FIG. 2) detects 11 rising edges 304, 306, and 310 above a predetermined threshold and thereby generates corresponding pulses 312, 314, and 318 on the edge pulse signal 354. Similarly, the edge detector 240 (FIG. 2) detects a falling edge 308 above a predetermined threshold and thereby generates pulse 316 on the edge pulse signal 354.

Returning to FIG. 2, a phase adjust circuit 245 receives the PLL clock 222 and generates a pixel clock 228 responsive to a phase adjust signal 238. The phase adjust circuit 245 comprises a clock delay circuit 244 connected to a multiplexer circuit 246. The clock delay circuit 244 generates a plurality of clock phases 260 by delaying the PLL clock 222.

An embodiment of the clock delay circuit 244 is an n-stage delay locked loop (DLL).

Figure 4:
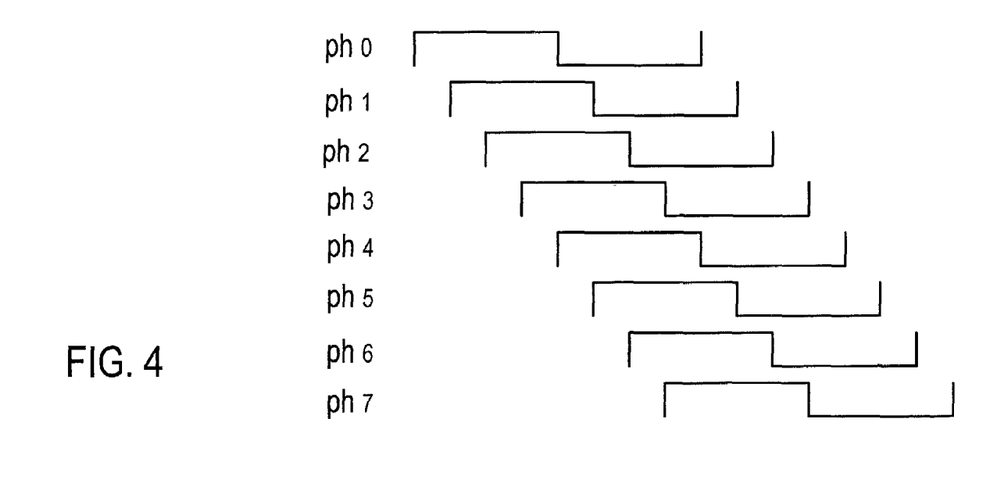
FIG. 4 is a timing diagram of the signals associated with an embodiment of the phase adjust circuit shown in FIG. 2.

The n-stage DLL circuit 244 generates n different clock phases 260 that are each 360/n degrees out of phase with the reference signal 210. FIG. 4 shows timing signals associated with an 8-stage (n=8) DLL circuit 244 comprising phase signals ph0-ph7 that are 45 degrees out of phase.

The multiplexer circuit 246 selects one of the phases 260 responsive to the phase adjust signal 238. In the case of an 8-stage DLL circuit 244, the multiplexer circuit 246 comprises an 8 to 1 multiplexer controlled by a three bit phase adjust signal 238.

An alternative embodiment of the phase adjust circuit 245 is a phase adjust circuit 245 that delays the reference signal 210 at the input of the phase detector 214. That is, the phase adjust circuit 245 is positioned at an input to the PLL circuit 212 and delays the reference signal 210.

A phase detector circuit 247 identifies one of the clock phases 260 most closely associated with the transition of the analog data signal 232 and generates the phase and frequency adjust signals 238 and 236, respectively. The phase detector circuit 247 substantially simultaneously analyzes the clock phases 260, generates a corresponding plurality of phase hit enable signals 249, and asserts the phase hit enable signal 249 corresponding to the transition of the analog signal 232. The phase detector circuit 247 does this analysis every clock cycle if the analog data signal 232 is transitioning every clock cycle. A person skilled in the art should understand that the phase detector circuit 247 might operate at a variety of different speeds corresponding to the analog data signal 232.

The phase hit counter 250 receives the plurality of phase hit enable signals 249 and generates a corresponding plurality of phase count signals ph0cnt . . . phncnt by counting the number of times corresponding phase hit enable signals 249 are asserted. The phase count analysis circuit 252 receives the phase count signals ph0cnt . . . phncnt and generates the phase and frequency adjust signals 238 and 236, respectively. A person skilled in the art should recognize that the phase count analysis circuit 252 might be implemented in hardware, software, or a combination of both. The phase hit counter 250 additionally receives an enable and a reset signal for enabling and resetting the counting.

Figure 5:
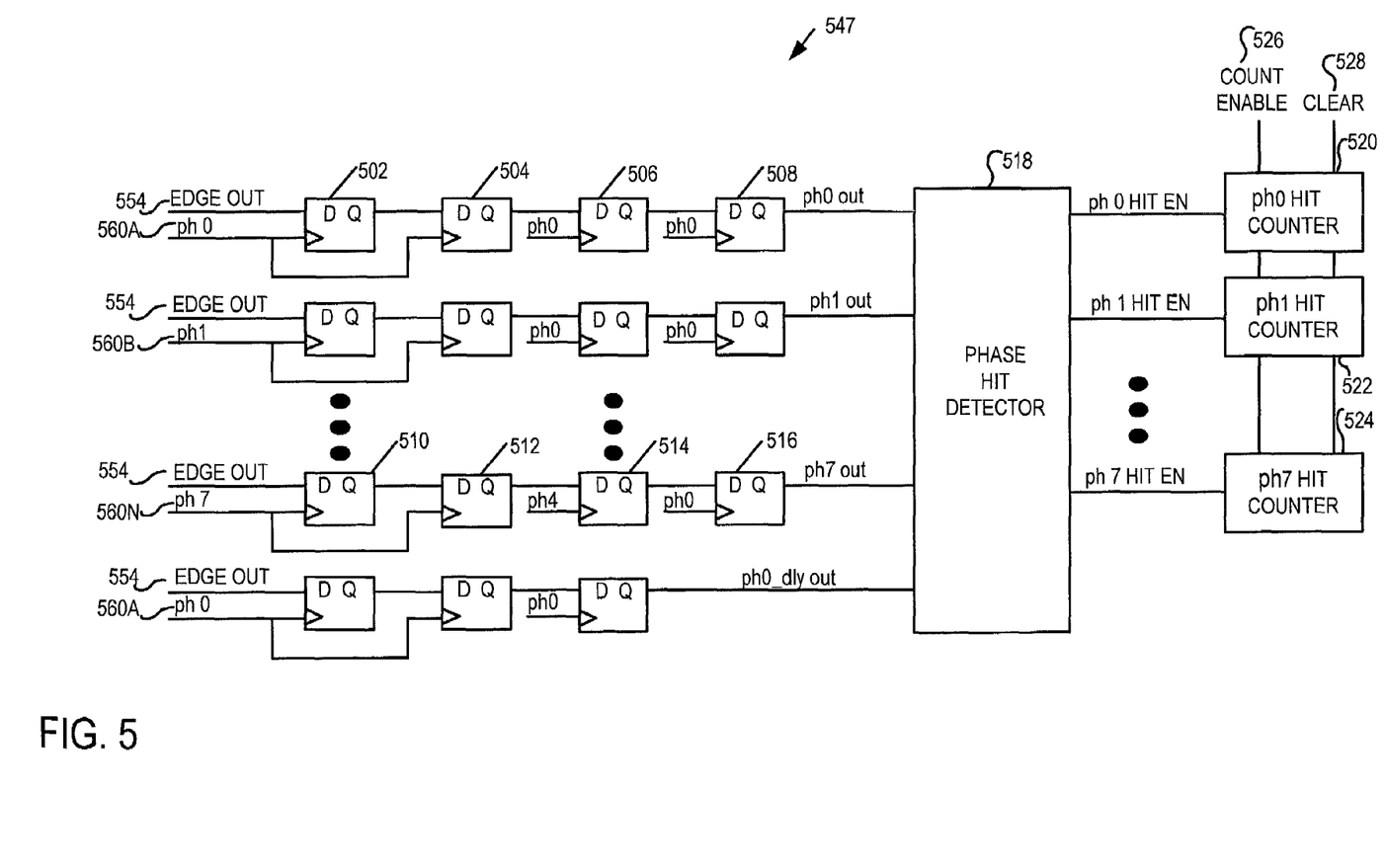
FIG. 5 is a block diagram of embodiments of the phase hit detector and phase counter circuits shown in FIG. 2.

FIG. 5 is a block diagram of an embodiment of the phase detector circuit 247 shown in FIG. 2. Referring to FIG. 5, the phase detector circuit 547 includes a plurality of flip flops, e.g., D-flip flops 502-512. The flip flops, e.g., D-flip flops 502-512, receive the edge pulse signal 554 at the data input. A corresponding one of the clock phase signals clock each of the flip flops. For example, flip flop 502 receives the edge pulse signal 554 at its data input and clock phase signal ph0 at its clock input and flip flop 510 receives the edge pulse signal 554 at its data input and clock phase ph7 at its clock input.

The phase detector circuit 547 double clocks the edge pulse signal 554 to avoid metastability issues. That is, two levels of flip flops clock the edge pulse signal 554 with a corresponding clock phase signal. For example, flip flops 502 and 504 clock the edge pulse signal 554 with clock phase signal ph0. Thereafter, the edge pulse signal 554 is realigned such that all the results from the different clock phases of a given clock cycle are available at the same time. With this realignment, the phase hit detectors 248 and phase hit counters 250 run synchronously off the same phase of the clock e.g., phase 0. This realignment is optional but convenient.

The clock phase signal ph0 is used twice: once to look for edges between clock phase signals ph0 and phi and again to look for edges between clock phase signals ph7 and ph0.

The phase hit detector 518 looks for adjacent phase out signals ph0_out . . . phn_out where one is at a first level, e.g. 0, and the next is at a second level, e.g. 1. The phase hit detector 518 then asserts the corresponding phase hit enable signal, e.g., ph0_hit_en . . . phn_hit_en for one clock cycle. The phase hit detector 518 asserts the corresponding phase hit enable signal according to the following equation:

$$ph\_n\_hit\_en = ph\_n\_out * !ph\_n\text{-}1\_out.$$

The phase hit enable signals, e.g., ph0_hit_en . . . phn_hit_en, advance the corresponding phase hit counters, e.g., phase hit counters 520-524. The phase hit counters accumulate the number of phase hits on each phase over some counting interval, e.g., a predetermined number of scan lines of the image, a selected number of pixels in an image frame, an entire image frame, multiple frames, and the like.

The phase hit counters, e.g., phase hit counters 520-524, might include a count enable signal 256 (FIG. 2) and a clear enable signal 258 (FIG. 2) to enable and clear, respectively, the count in the phase hit counters.

Referring to FIG. 2, a phase count analysis circuit 252 reads the phase hit count signals, e.g., signals ph0cnt . . . phncnt, and generates the phase and frequency adjust signals 238 and 236, respectively, relative to the analog data signal 232 using the following algorithms.

To determine the correct clock frequency and thereby generate the frequency adjust signal 236 (FIG. 2), the phase hit counters 250 count the number of phase hit enable signals ph0_hit_en . . . phn_hit_en asserted over a predetermined period, e.g., a number of scan lines of the image. The phase count analysis circuit 252 generates the frequency adjust signal depending on an examination of the contents of the phase hit counters, e.g., phase hit counters 520-524. For example, if only a some of the phase hit counters e.g., less than 50%, show a significant number of hits, then the frequency of the pixel clock 228 is set correctly and the frequency adjust signal 236 remains unchanged. That is, the frequency of the pixel clock 228 is set correctly if only a predetermined low number of the phase hit counters have hits. Otherwise, the phase count analysis circuit 252 generates a corresponding frequency adjust signal 236.

If, on the other hand, all of the phase hit counters 250, that is 100% of the phase hit counters, have a predetermined high number of hits, the frequency of the pixel clock 228 is set incorrectly and must be adjusted. A predetermined high number of hits indicate that the image data is moving in and out of phase with the PLL clock 222. The circuit 200 adjusts the frequency of the pixel clock 228 by generating a appropriate frequency adjust signal, clearing the counters by asserting the clear signal 258, enabling the counters by asserting the enable signal 256, and reading the phase hit counters again after a predetermined time lapse. The circuit 200 repeats this process until the frequency of the pixel clock 228 is set correctly. Searching the proper frequency can be done by a linear search, binary search, or any other searching method known to a person of skill in the art.

The process described above might be performed several times in one vertical synchronization period since the PLL circuit 212 settles relatively quickly—usually in a few lines e.g., less than 100—after changing the frequency adjust signal 236. The process of measuring the frequency is also relatively quick—usually a few lines. Being able to do multiple iterations during each vertical synchronization period allows the correct frequency to be found quickly.

Once the pixel clock 228 is set to the appropriate frequency, the circuit 200 might adjust its clock phase as follows. The circuit 200 clears the phase hit counters by asserting the clear signal 258 and enables the phase hit counters for a predetermined amount of time by asserting the enable signal 256. The phase count analysis circuit 252 reads the phase hit counters 250. At this point, only a few of the phase hit counters will show any appreciable number of hits (more than one due to the PLL clock jitter). The phase count analysis circuit 252 generates a phase adjust signal 238 corresponding to the phase of the PLL clock associated with the largest number of hits. One advantage is that the circuit 200 might adjust the phase of the pixel clock 228 immediately after only one read of the phase hit counters 250 improving operating speed. Previous techniques for determining proper clock phase typically require changing the phase multiple times before making a determination about which phase is correct. Previous techniques are therefore slow by comparison.

Figure 6:
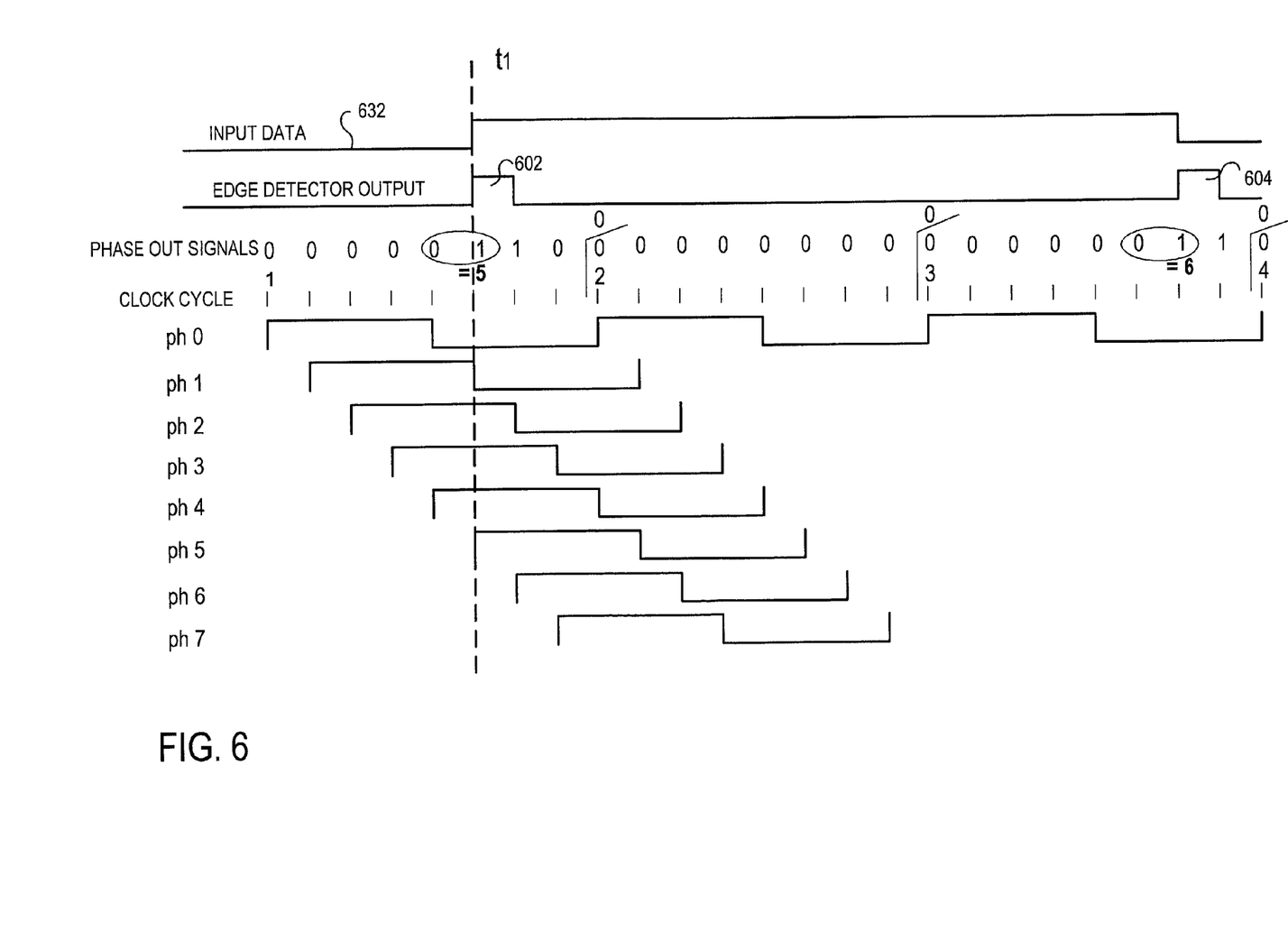
FIG. 6 is a timing diagram of the signals associated with embodiments of the phase hit detector and phase counter circuits shown in FIGS. 2 and 5.

An exemplary operation of the automatic phase and frequency adjust circuit 200 (FIG. 2) and the phase detector circuit 547 (FIG. 5) will be explained with reference to FIG. 6. Referring to FIGS. 2, 5, and 6, the input data 632 transitions from a first level to a second level at a time t1 during clock cycle 1. The edge detector 240 (FIG. 2) detects the transition of the analog signal 632 and generates a pulse 602. The phase detector circuit 547 identifies and asserts phase out signal ph5_out and ph6_out responsive to the edge pulse signal 654 and the clock phase signals ph0 . . . ph7. That is, the phase detector circuit 547 identifies the phase signal ph5 as most closely associated with the transition of the analog data signal 632 as indicated by the edge pulse signal 654. The phase hit detector 518 looks for adjacent phase out signals ph0_out . . . ph7_out where one signal is at a first level, e.g., 0, and a second is a second level, e.g., 1. As a result, the phase hit detector 518 enables the phase hit enable signal ph5_hit_en corresponding to the phase signal (ph5) closest to the first transition of the analog signal 632. The phase hit detector 518 asserts the phase hit enable signal ph5_hit_en for one clock cycle.

Similarly, the second transition of the analog signal 632 causes the pulse 604 on the edge pulse signal 654 occurring on the fourth clock cycle. The phase hit detector circuit 547 identifies the phase signal ph0 . . . ph7, phase signal ph6 in this case, most closely associated 11 with the transition of the analog data signal 632 as indicated by the edge pulse signal 654. The phase hit detector 518 looks for adjacent phase out signals ph0_out . . . ph7_out where on signal is at a first level, e.g. 0, and the second is at a second level, e.g. 1. As a result, the phase hit detector 518 enables the phase hit enable signal ph6 hit en corresponding to the phase signal ph6 as closest to the first transition of the analog signal 632. The phase hit detector 518 asserts the phase hit enable signal ph6 hit en for one clock cycle. The PLL phase signal is then set based on some predetermined optimal phase offset between the transitions in the analog input data 242 (FIG. 2) and the pixel clock 228 (FIG. 2).

The phase hit detector 518 might alternatively assert the corresponding phase hit enable signal for longer than a clock cycle depending on whether the circuit 200 (FIG. 2) detects a transition from a first level to a second level (e.g., 0 to 1 transition). For example, if the analog image data 242 (FIG. 2) is changing from black to white every clock cycle then it is possible for the phase hit enable signal for a given phase to be active for all of the active pixels of a scan line.

A calibration circuit 242 calibrates the circuit 200 by determining the relationship between the measured phase hit and the desired optimal phase hit. The calibration circuit 242 receives the pixel clock 228 and the analog data signal 232 and provides the resulting signal to the edge detector circuit 240. By so manipulating the pixel clock 228 with the analog data signal 232, it is possible to determine the optimum phase alignment of the edge data of the analog data signal 232. Optimum phase will result by positioning the edges of the analog data 232 so that they occur just after a rising edge, for example, of the pixel clock 228. By so calibrating the circuit 200, the analog data has the most settling time and will result in the least amount of digitized noise.

It should be readily apparent that one or more devices that include logic circuit might implement the present invention. A dedicated processor system that includes a microcontroller or a microprocessor might alternatively implement the present invention.

The invention additionally provides methods, which are described below. Moreover, the invention provides apparatus that performs or assists in performing the methods of the invention. This apparatus might be specially constructed for the required purposes or it might comprise a general-purpose computer selectively activated or reconfigured by a computer program stored in the computer. The methods and algorithms presented herein are not necessarily inherently related to any particular computer or other apparatus. In particular, various general-purpose machines might be used with programs in accordance with the teachings herein or it might prove more convenient to construct more specialized apparatus to perform the required method steps. The required structure for a variety of these machines will appear from this description.

Useful machines or articles for performing the operations of the present invention include general-purpose digital computers or other similar devices. In all cases, there should be borne in mind the distinction between the method of operating a computer and the method of computation itself. The present invention relates also to method steps for operating a computer and for processing electrical or other physical signals to generate other desired physical signals.

The invention additionally provides a program and a method of operation of the program. The program is most advantageously implemented as a program for a computing machine, such as a general-purpose computer, a special purpose computer, a microprocessor, and the like.

The invention also provides a storage medium that has the program of the invention stored thereon. The storage medium is a computer-readable medium, such as a memory, and is read by the computing machine mentioned above.

A program is generally defined as a sequence of processes leading to a desired result. These processes, also known as instructions, are those requiring physical manipulations of physical quantities. Usually, though not necessarily, these quantities take the form of electrical or magnetic signals capable of being stored, transferred, combined, compared, and otherwise manipulated or processed. When stored, they might be stored in any computer-readable medium. It is convenient at times, principally for reasons of common usage, to refer to these signals as bits, data bits, samples, values, elements, symbols, characters, images, terms, numbers, or the like. It should be borne in mind, however, that all of these and similar terms are associated with the appropriate physical quantities, and that these terms are merely convenient labels applied to these physical quantities.

This detailed description is presented largely in terms of flowcharts, display images, algorithms, and symbolic representations of operations of data bits within a computer readable medium, such as a memory. Such descriptions and representations are the type of convenient labels used by those skilled in programming and/or the data processing arts to effectively convey the substance of their work to others skilled in the art. A person skilled in the art of programming might use this description to readily generate specific instructions for implementing a program according to the present invention. For the sake of economy, however, flowcharts used to describe methods of the invention are not repeated in this document for describing software according to the invention.

Often, for the sake of convenience only, it is preferred to implement and describe a program as various interconnected distinct software modules or features, collectively also known as software. This is not necessary, however, and there might be cases where modules are equivalently aggregated into a single program with unclear boundaries. In any event, the software modules or features of the present invention might be implemented by themselves, or in combination with others. Even though it is said that the program might be stored in a computer-readable medium, it should be clear to a person skilled in the art that it need not be a single memory, or even a single machine. Various portions, modules or features of it might reside in separate memories or separate machines where the memories or machines reside in the same or different geographic location. Where the memories or machines are in different geographic locations, they might be connected directly or through a network such as a local access network (LAN) or a global computer network like the Internet®.

In the present case, methods of the invention are implemented by machine operations. In other words, embodiments of the program of the invention are made such that they perform methods of the invention that are described in this document. These might be optionally performed in conjunction with one or more human operators performing some, but not all of them. As per the above, the users need not be collocated with each other, but each only with a machine that houses a portion of the program. Alternately, some of these machines might operate automatically, without users and/or independently from each other.

Methods of the invention are now described. A person having ordinary skill in the art should recognize that the boxes described below might be implemented in different combinations, and in different order. Some methods might be used for determining a location of an object, some to determine an identity of an object, and some both.

Figure 7:
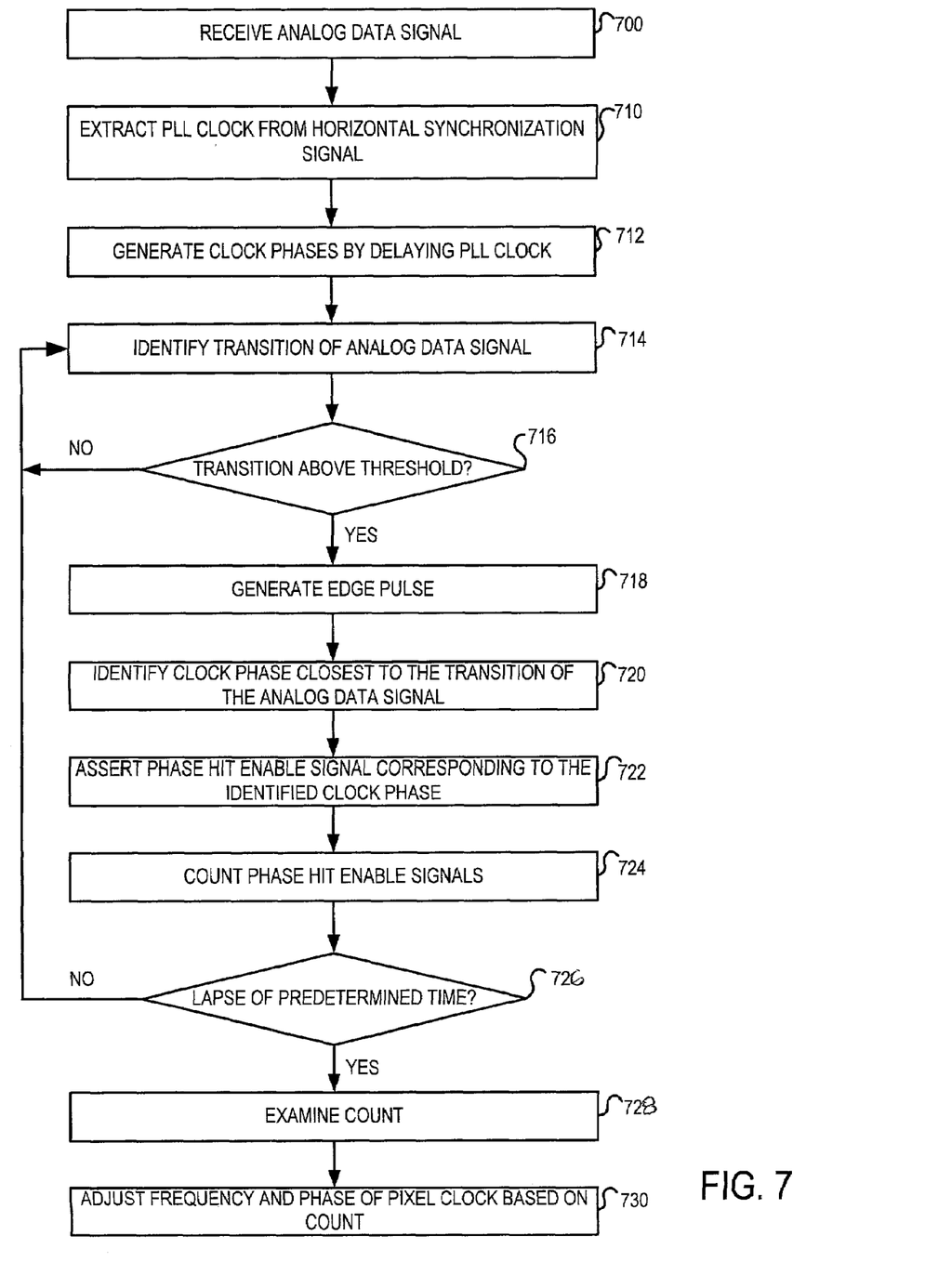
FIG. 7 is a flowchart of a method for automatically adjusting the phase and frequency of image data according to an embodiment of the present invention.

Referring to FIG. 7, after the circuit receives the analog data signal at box 710, it extracts the PLL clock from a reference signal, e.g., the horizontal synchronization signal, corresponding to the analog data signal. At box 712, the circuit generates a plurality of clock phases by delaying the PLL clock. The circuit identifies a transition of the analog signal at box 714 and then compares the transition with a predetermined threshold, e.g., a portion of the total signal swing (box 716). If the transition is, for example, smaller than the threshold, then circuit operation returns to box 714 where it identifies and tests the next transition.

If, however, the transition is greater than the threshold, the circuit generates an edge pulse at box 718. The circuit identifies one of the plurality of clock phases closest to the transition of the analog data as indicated by the rising edge of the edge pulse (box 720). At box 722, the circuit asserts a phase hit enable signal corresponding to the identified clock phase. A counter circuit keeps a count of asserted phase hit enable signals corresponding to each of the clock phases (box 724). The count continues for a predetermined time e.g., a predetermined number of image scan lines (box 726). If the predetermined time has not lapsed, then circuit operation returns to box 714 by identifying analog data signal transitions. If the predetermined time has lapsed, the circuit examines the count (box 728) and adjusts the frequency and phase of the pixel clock based on the count (box 730).

Figure 8:
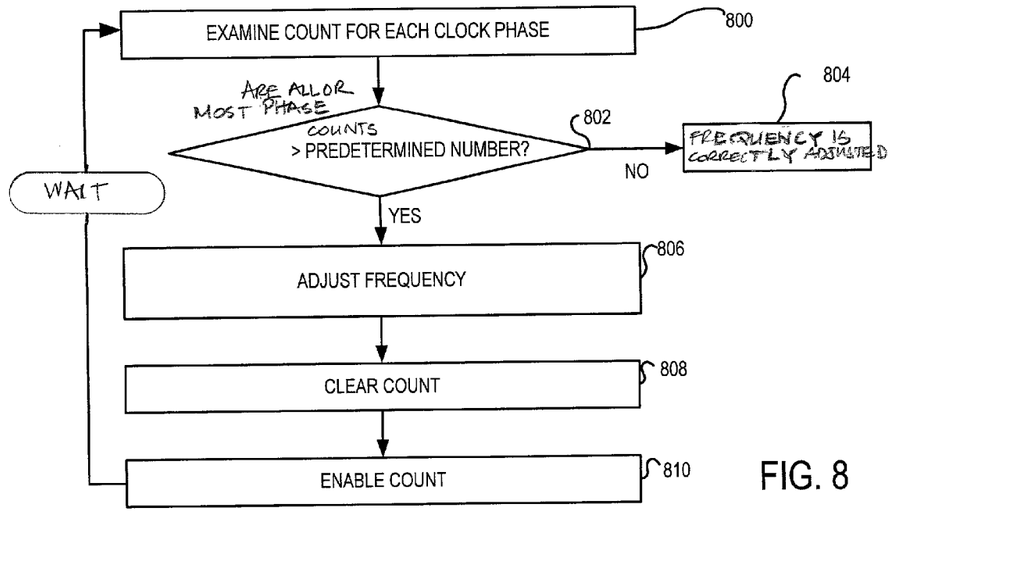
FIG. 8 is a flowchart of a method for automatically adjusting the frequency of the image data according to an embodiment of the present invention.

FIG. 8 is a flowchart of an embodiment for a method of automatically adjusting the frequency of the pixel clock. Referring to FIG. 8, the circuit examines the count for each clock phase over a predetermined time e.g., a predetermined number of scan lines. If some of the phase hit counts are very low (box 802), then the phase is set correctly (box 804). If the count for all or most of the phases greater than a predetermined number (box 802), the circuit adjusts the frequency by generating an appropriate frequency adjust signal that is provided to the PLL circuit (box 806). The ensure a properly adjusted frequency, the circuit clears the count (box 808) and enables the count once more (box 810) for a predetermined time e.g., a predetermined number of scan lines. The circuit operation returns to box 800 until the circuit verifies that the frequency of the pixel clock is properly adjusted.

The circuit might perform the above described frequency adjust operation many times in one vertical synchronization period since the PLL settling time after adjusting the frequency is usually only a few lines. The operation described above allows the circuit to measure the frequency of the pixel clock also in only a few lines e.g., in less than 100 lines. Thus, speed is a significant advantage to the circuit operation described above.

Figure 9:
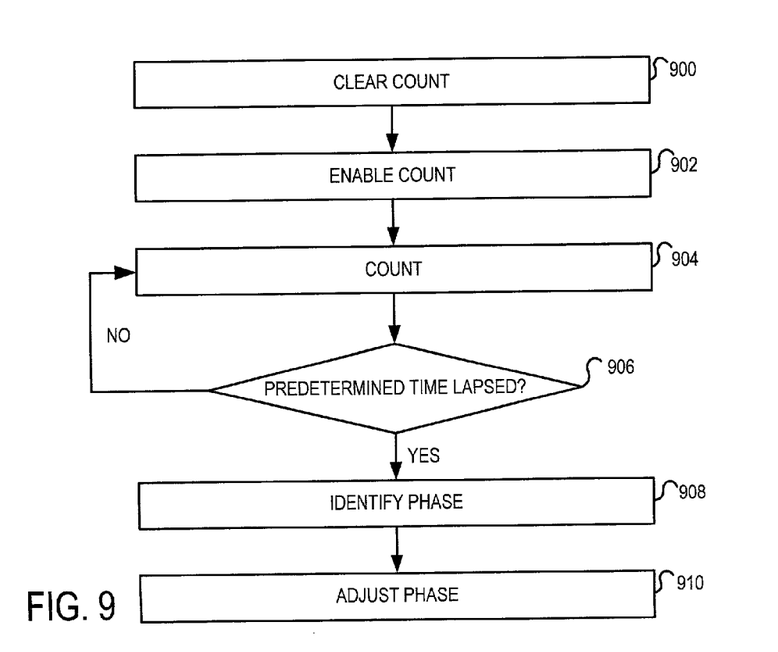
FIG. 9 is a flowchart of a method for automatically adjusting the phase of the image data according to an embodiment of the present invention.

FIG. 9 is a flowchart of an embodiment for a method of automatically adjusting the phase of the pixel clock. Referring to FIG. 9, the circuit clears the count (box 900) and enables the count (box 902). After maintaining the count for a predetermined time (boxes 904 and 906), the circuit identifies the phase most closely associated with the transition of the analog data (box 908). At box 910, the circuit adjusts the phase of the pixel clock by generating an appropriate phase adjust signal that is provided to the phase adjust circuit.

After the circuit adjusts the frequency, only a few of the phase hit counters will show any appreciable number of hits (more than one counter will show hits due to the PLL jitter). The circuit might adjust the phase after only one read of the phase hit counters resulting in a substantial speed advantage over prior known techniques.

Having illustrated and described the principles of my invention in a preferred embodiment thereof, it should be readily apparent to those skilled in the art that the invention can be modified in arrangement and detail without departing from such principles. I claim all modifications coming within the spirit and scope of the accompanying claims.

The invention claimed is:

1. An automatic phase and frequency adjust circuit, comprising:
    a phase locked loop circuit to generate a phase locked loop clock responsive to a reference signal;
    an edge detector circuit to generate an edge pulse signal corresponding to a transition of an analog data signal above a predetermined threshold responsive to a pixel clock;
    a phase detector circuit to generate a phase adjust signal responsive to a phase of the phase locked loop clock and the edge pulse signal; and
    a phase adjust circuit to generate the pixel clock responsive to the phase adjust signal and the phase locked loop clock, where the phase adjust circuit simultaneously generates a plurality of delayed clock signals by delaying the phase locked loop clock.

2. The automatic phase and frequency adjust circuit of claim 1 wherein the phase locked loop circuit comprises:
    a phase detector adapted to receive the reference signal;
    a loop filter coupled to the phase detector;
    a voltage controlled oscillator coupled to the loop filter;
    a feedback loop adapted to receive the phase locked loop clock and provide a feedback signal responsive to a frequency adjust signal.

3. The automatic phase and frequency adjust circuit of claim 1 wherein the reference signal is a horizontal synchronization signal.

4. The automatic phase and frequency adjust circuit of claim 1 wherein the threshold is programmable.

5. The automatic phase and frequency adjust circuit of claim 1 wherein the edge detector generates the edge pulse corresponding to a rising, falling, or both rising and falling edges of the analog data signal.

6. The automatic phase and frequency adjust circuit of claim 1 wherein the phase adjust circuit adjusts the phase of the pixel clock by delaying the reference signal.

7. The automatic phase and frequency adjust circuit of claim 1 wherein the phase adjust circuit adjusts the phase of the pixel clock by delaying the phase locked loop clock.

8. The automatic phase and frequency adjust circuit of claim 7 wherein the phase adjust circuit comprises:
    a clock delay circuit to generate a plurality of delayed clock signals by delaying the phase locked loop clock; and
    a multiplexer to select one of the plurality of delayed clock signals as the pixel clock responsive to a phase adjust signal.

9. The automatic phase and frequency adjust circuit of claim 8 wherein the clock delay circuit comprises an n-stage delay locked loop, each stage generating a corresponding delayed clock phase, each delayed clock phase being 360/n degrees out of phase.

10. The automatic phase and frequency adjust circuit of claim 1 wherein the phase detector comprises:
    a phase hit detector to generate a plurality of phase hit enable signals corresponding to the plurality of delayed clock signals and assert one of the phase hit enable signals responsive to the edge pulse signal; and
    a phase hit counter to count asserted phase hit enable signals for each of the delayed clock signals over a predetermined time.

11. The automatic phase and frequency adjust circuit of claim 10 wherein the predetermined time is a number of image scan lines.

12. The automatic phase and frequency adjust circuit of claim 10 wherein the phase hit detector comprises:
    a plurality of flip-flop circuits corresponding to the plurality of delayed clock signals to generate a corresponding plurality of phase out signals; and
    a comparison circuit to comparing the plurality of phase out signals.

13. The automatic phase and frequency adjust circuit of claim 12 wherein the comparison circuit compares adjacent phase out signals.

14. The automatic phase and frequency adjust circuit of claim 10 wherein the phase hit counter comprises:
    an enable signal to enable counting of asserted phase hit enable signals; and
    a clear signal to clear the phase hit counter.

15. The automatic phase and frequency adjust circuit of claim 10 comprising:
    a phase count analysis circuit to generate phase and frequency adjust signals by analyzing the count of asserted phase hit enable signals.

16. The automatic phase and frequency adjust circuit of claim 1 comprising an auto calibration circuit to align the analog data signal with the pixel clock.

* * * * *

UNITED STATES PATENT AND TRADEMARK OFFICE
CERTIFICATE OF CORRECTION

PATENT NO. : 7,327,400 B1
APPLICATION NO. : 09/888271
DATED : February 5, 2008
INVENTOR(S) : Robert Y. Greenberg It is certified that error appears in the above-identified patent and that said Letters Patent is hereby corrected as shown below:

Column 3, line 25, the words "detects 11" should read -- detects --;
Column 4, line 41, the word "phi" should read -- ph1 --;
Column 6, line 19, the words "11 with" should read -- with --;
Column 6, line 25, the words "ph6 hit en" should read -- ph6_hit_en --;
Column 6, line 28, the words "ph6 hit en" should read -- ph6_hit_en --.

Signed and Sealed this

First Day of September, 2009

David J. Kappos
*Director of the United States Patent and Trademark Office*